United States Patent
Zhu et al.

(10) Patent No.: US 11,895,852 B2
(45) Date of Patent: Feb. 6, 2024

(54) METHOD FOR FORMING SEMICONDUCTOR STRUCTURE BY USING SACRIFICIAL LAYER CONFIGURED TO BE REPLACED SUBSEQUENTLY TO FORM BIT LINE, SEMICONDUCTOR STRUCTURE, AND MEMORY

(71) Applicant: CHANGXIN MEMORY TECHNOLOGIES, INC., Hefei (CN)

(72) Inventors: Yiming Zhu, Hefei (CN); Erxuan Ping, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 207 days.

(21) Appl. No.: 17/460,414

(22) Filed: Aug. 30, 2021

(65) Prior Publication Data

US 2021/0391330 A1 Dec. 16, 2021

Related U.S. Application Data

(63) Continuation of application No. PCT/CN2021/089781, filed on Apr. 26, 2021.

(30) Foreign Application Priority Data

Apr. 27, 2020 (CN) .......................... 202010343487.9

(51) Int. Cl.
*H01L 21/76* (2006.01)
*H10B 99/00* (2023.01)
(Continued)

(52) U.S. Cl.
CPC ....... *H10B 99/00* (2023.02); *H01L 21/76877* (2013.01); *H01L 27/088* (2013.01);
(Continued)

(58) Field of Classification Search
CPC ...... H10B 99/00; H10B 12/482; H10B 53/30; H10B 12/05; H10B 12/315; H10B 61/22;
(Continued)

(56) References Cited

U.S. PATENT DOCUMENTS 6,331,459 B1 12/2001 Gruening
9,419,217 B2 8/2016 Vereen
(Continued)

FOREIGN PATENT DOCUMENTS

CN 101546731 A 9/2009
CN 102315221 A 1/2012
(Continued)

OTHER PUBLICATIONS

International Search Report in the international application No. PCT/CN2021/089781, dated Jul. 28, 2021, 2 pgs.
(Continued)

*Primary Examiner* — Mohammad M Hoque
(74) *Attorney, Agent, or Firm* — Cooper Legal Group, LLC

(57) ABSTRACT

A method for forming a semiconductor structure includes: providing a substrate, a sacrificial layer and active layer on sacrificial layer being formed on the substrate; etching the active layer and sacrificial layer up to a surface of the substrate to form a plurality of active lines arranged in parallel and extending along first direction; filling an opening located between two adjacent ones of active lines to form a first isolating layer; etching an end of active lines to form an opening hole; removing sacrificial layer along opening hole, to form a gap between a bottom of the active lines and substrate; filling a conductive material in the gap to form a bit line extending along first direction; patterning the active lines to form a plurality of separate active pillars arrayed along first direction and second direction; and forming
(Continued)

semiconductor pillars on top surfaces of respective ones of the active pillars.

12 Claims, 25 Drawing Sheets

(51) Int. Cl.
*H01L 21/768* (2006.01)
*H01L 27/088* (2006.01)
*H01L 29/06* (2006.01)
*H01L 29/66* (2006.01)
*H01L 29/78* (2006.01)

(52) U.S. Cl.
CPC .... *H01L 29/0649* (2013.01); *H01L 29/66666* (2013.01); *H01L 29/7827* (2013.01)

(58) Field of Classification Search
CPC ........ H10B 63/34; H10B 63/80; H10B 12/02; H10B 12/30; H01L 21/76877; H01L 27/088; H01L 29/0649; H01L 29/66666; H01L 29/7827; H01L 29/78642; H01L 21/743; H01L 21/8234
USPC .......................................................... 257/329
See application file for complete search history.

(56) References Cited

U.S. PATENT DOCUMENTS

| | | | |
|---|---|---|---|
| 10,050,086 | B2 | 8/2018 | Vereen et al. |
| 10,134,739 | B1 * | 11/2018 | Zang ................. H01L 29/42376 |
| 10,529,778 | B2 | 1/2020 | Vereen et al. |
| 2010/0059837 | A1 | 3/2010 | Kim |
| 2011/0065275 | A1 | 3/2011 | Kim |
| 2011/0215396 | A1 | 9/2011 | Tang |
| 2011/0269251 | A1 | 11/2011 | Kim |
| 2012/0146237 | A1 | 6/2012 | Yun |
| 2013/0161832 | A1 | 6/2013 | Cho |
| 2013/0210211 | A1 | 8/2013 | Vereen |
| 2014/0232014 | A1 | 8/2014 | Cho |
| 2017/0033158 | A1 | 2/2017 | Vereen et al. |
| 2019/0035791 | A1 * | 1/2019 | Zang ................... H01L 29/1037 |
| 2019/0051701 | A1 | 2/2019 | Vereen et al. |
| 2019/0074363 | A1 | 3/2019 | Zhu |
| 2019/0157345 | A1 | 5/2019 | Zhu et al. |
| 2020/0258940 | A1 | 8/2020 | Vereen et al. |
| 2021/0074334 | A1 | 3/2021 | Zhu |

FOREIGN PATENT DOCUMENTS

| | | |
|---|---|---|
| CN | 102468321 A | 5/2012 |
| CN | 102522407 A | 6/2012 |
| CN | 102468181 B | 3/2016 |
| CN | 207868200 U | 9/2018 |
| CN | 108777253 A | 11/2018 |
| CN | 208127209 U | 11/2018 |
| CN | 109148376 A | 1/2019 |
| CN | 109285836 A | 1/2019 |
| CN | 109285838 A | 1/2019 |
| CN | 109461738 A | 3/2019 |
| CN | 109461756 A | 3/2019 |
| CN | 208923136 U | 5/2019 |
| CN | 110383476 A | 10/2019 |
| JP | H06268173 A | 9/1994 |
| JP | 2002289815 A | 10/2002 |
| TW | 1222180 B | 10/2004 |
| WO | 2020042253 A1 | 3/2020 |
| WO | 2020042255 A1 | 3/2020 |

OTHER PUBLICATIONS

Supplementary European Search Report in the European application No. 21765539.8, dated May 25, 2023. 8 pages.

* cited by examiner

METHOD FOR FORMING SEMICONDUCTOR STRUCTURE BY USING SACRIFICIAL LAYER CONFIGURED TO BE REPLACED SUBSEQUENTLY TO FORM BIT LINE, SEMICONDUCTOR STRUCTURE, AND MEMORY

CROSS-REFERENCE TO RELATED APPLICATIONS

The present application is a continuation application of International Patent Application No. PCT/CN2021/089781, filed on Apr. 26, 2021, entitled "Semiconductor structure, method for forming semiconductor structure and memory", which claims priority to Chinese patent application No. 202010343487.9, filed on Apr. 27, 2020, entitled "Semiconductor structure, method for forming semiconductor structure and memory". The contents of International Patent Application No. PCT/CN2021/089781 and Chinese patent application No. 202010343487.9 are hereby incorporated by reference in their entireties.

TECHNICAL FIELD

The present application relates to the technical field of semiconductors, and in particular to a semiconductor structure, a method for forming the semiconductor structure, and a memory.

BACKGROUND

An existing memory usually includes a data memory cell and a control transistor for controlling the data memory cell. The integration level of the transistor restricts the storage density of the memory. For a planar transistor, the related art reduces the size of the transistor by reducing the channel size of the transistor, thereby improving the storage density of the memory.

However, as the channel size of the transistor reduces, the narrow channel effect and the short channel effect cause the performance of the transistor to decline, so that the performance of the memory is affected, and the further improvement of the size of the transistor and the storage density of the memory is restricted.

How to reduce the planar size of the transistor and improve the storage density of the memory without reducing the performance of the transistor is an urgent problem to be solved at present.

SUMMARY

The technical problem to be solved by some embodiments of the present application is to provide a semiconductor structure, a method for forming the semiconductor structure, a memory, and a method for forming the memory.

In order to solve the above problems, one embodiment of the present application provides a method for forming a semiconductor structure. The method includes: a substrate is provided, where a sacrificial layer and an active layer located on a surface of the sacrificial layer are formed on the substrate; the active layer and the sacrificial layer are etched up to a surface of the substrate to form a plurality of active lines arranged in parallel and extending along a first direction; an opening located between two adjacent one of the active lines is filled to form a first isolating layer; an end of the active lines is etched to form an opening hole exposing the surface of the substrate, a side wall of the opening holes exposing the sacrificial layer; the sacrificial layer is removed along the opening hole to form a gap between a bottom of the active lines and the substrate; a conductive material is filled in the gap to form a bit line extending along the first direction; the active lines are patterned to form a plurality of separate active pillars that are arrayed along the first direction and a second direction; and semiconductor pillars are formed on top surfaces of respective ones of the active pillars.

According to the technical solution of one embodiment of the present application, a semiconductor structure is also provided, including: a substrate; a plurality of separate active pillars, located on the substrate and arrayed along a first direction and a second direction, a gap being provided between the active pillars and the substrate; a bit line located in the gap; and semiconductor pillars located on top surfaces of respective ones of the active pillars.

According to the technical solution of one embodiment of the present application, a memory is also provided, including: a semiconductor structure; and a memory cell located above the semiconductor structure. The semiconductor structure includes: a substrate; a plurality of separate active pillars, located on the substrate and arrayed along a first direction and a second direction, a gap being provided between the active pillars and the substrate; a bit line located in the gap; and semiconductor pillars located on top surfaces of respective ones of the active pillars. The memory cell is connected to a top surface of the second doped region.

BRIEF DESCRIPTION OF THE DRAWINGS

In order to describe the technical solutions in the embodiments of the present application more clearly, the following briefly introduces the accompanying drawings required in the embodiments of the present application. It is apparent to those of ordinary skill in the art that the drawings in the following description are only some embodiments of the present application, and that other drawings may be obtained from these drawings without involving any inventive effort.

DETAILED DESCRIPTION

In order to clarify the purpose, technical means, and effects of the present application, the present application will be further described below with reference to the accompanying drawings. It should be understood that the embodiments described herein are only a portion of the embodiments of the present application, not all embodiments, and are not intended to limit the present application. Based on the embodiments in the present application, all other embodiments obtained by those skilled in the art without involving any inventive effort are within the scope of protection of the present application.

Referring to FIG. 1 to FIG. 11C, schematic diagrams of a forming process of a semiconductor structure according to an embodiment of the present application are shown.

Figure 1:
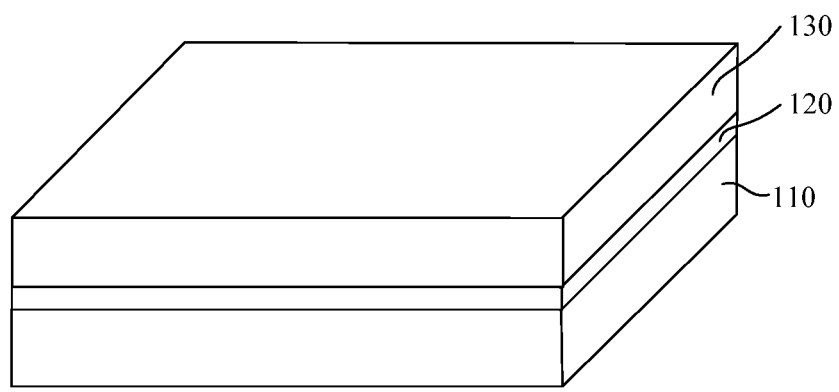
FIG. 1 to FIG. 11C are schematic diagrams of a forming process of a semiconductor structure according to an embodiment of the present application.

Referring to FIG. 1, a substrate 110 is provided. A sacrificial layer 120 and an active layer 130 located on a surface of the sacrificial layer 120 are formed on a surface of the substrate 110.

The substrate 110 may be made of various semiconductor materials such as single crystal silicon, germanium, and SiC. The substrate 110 may be a single-layer structure, or may be a composite structure. For example, the substrate 110 includes, but is not limited to, a semiconductor base and a dielectric layer formed on the surface of the semiconductor base.

The sacrificial layer 120 and the active layer 130 may be sequentially formed on the surface of the substrate 110 by a deposition process. The active layer 130 adopts a semiconductor material, such as one or more semiconductor materials of Si, Ge, SiC or SiG. The material of the sacrificial layer 120 is different from that of the substrate 110 and the active layer 130, so that the influence on the substrate 110 and the active layer 130 is reduced during the subsequent removal of the sacrificial layer 120.

In the present embodiment, the substrate 110 is a silicon substrate, the sacrificial layer 120 is a SiGe layer, and the active layer 130 is a silicon layer. After the sacrificial layer 120 is epitaxially formed on the surface of the substrate 110 by an epitaxial growth process, the active layer 130 is formed on the surface of the sacrificial layer 120 by an epitaxial process.

In practice, the material of the sacrificial layer 120 is different from the materials of the substrate 110 and the active layer 130, and there is a higher etching selection ratio between the sacrificial layer 120 and the substrate 110 and there is a higher etching selection ratio between the sacrificial layer 120 and the active layer 130 during the removal of the sacrificial layer 120.

In some embodiments, the substrate 110, the sacrificial layer 120, and the active layer 130 may be an SOI substrate, and a buried oxide layer in the SOI substrate serves as the sacrificial layer 120.

In other embodiments, a doped layer may be formed inside a bulk silicon substrate to serve as the sacrificial layer 120 by implanting ions in the bulk silicon substrate. For example, Ge is implanted in the bulk silicon, and a SiGe layer is formed inside the bulk silicon to serve as the sacrificial layer 120 by controlling the implantation depth of Ge. A silicon layer below the doped layer serves as the substrate 110, and a silicon layer above the doped layer serves as an active layer. In other embodiments, the doped layer may be formed by implanting other elements, such as C, 0, and N. The etching rate of the doped layer is different from that of material layer above the doped layer and that of the material layer below the doped layer, thereby forming the sacrificial layer 120. Preferably, the material of the sacrificial layer 120 may be silicon oxide, silicon nitride, silicon oxynitride, silicon oxycarbide, etc.

The active layer 130 is configured to form a bottom doped region, i.e., a source/drain, of a vertical transistor. The sacrificial layer 120 is configured to be replaced subsequently to form a bit line. The thicknesses of the sacrificial layer 120 and the active layer 130 are reasonably set according to the size of the vertical transistor to be formed and the size of the bit line. In one embodiment, the sacrificial layer 120 may have a thickness of 35-50 nm, and the active layer 130 may have a thickness of 30-50 nm. In the present embodiment, the bottom doped region of the transistor is formed separately from an upper channel region and a top doped region, so that the thickness of the active layer 130 can be reduced, and the probability that a formed active pattern collapses after the active layer 130 is patterned can be reduced.

Figure 2:
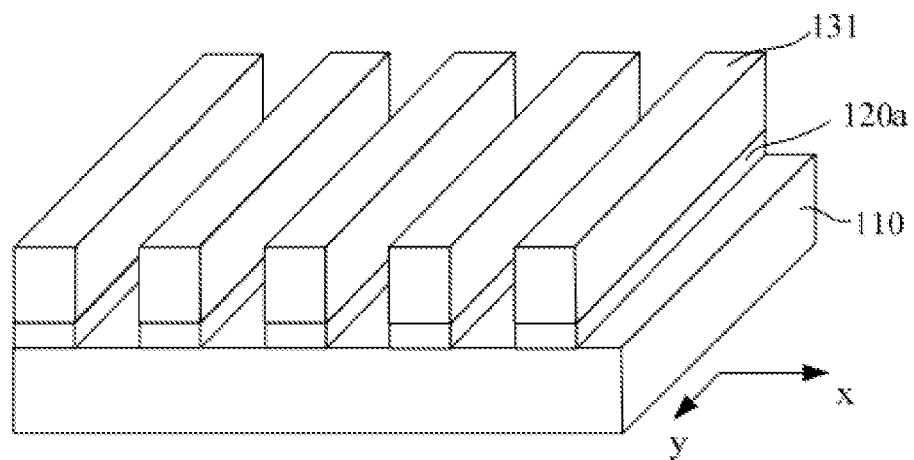

Referring to FIG. 2, the active layer 130 and the sacrificial layer 120 are etched up to the surface of the substrate 110 to form a plurality of active lines 131 arranged in parallel and extending along a first direction.

In the present embodiment, the operation that the active lines 131 are formed further includes the following operations. A patterned mask layer (not shown) is formed on the surface of the active layer 130. An opening pattern extending along the first direction is provided in the patterned mask layer. The active layer 130 and the sacrificial layer 120 are etched by taking the patterned mask layer as a mask to form elongated active lines 131 and elongated sacrificial layers 120a.

In the present embodiment, the first direction is a y-direction. The active layer 130 and the sacrificial layer 120 are etched by adopting a dry etching process. A corresponding etching gas is selected at a corresponding etching stage to etch the active layer 130 and the sacrificial layer 120.

Figure 3:
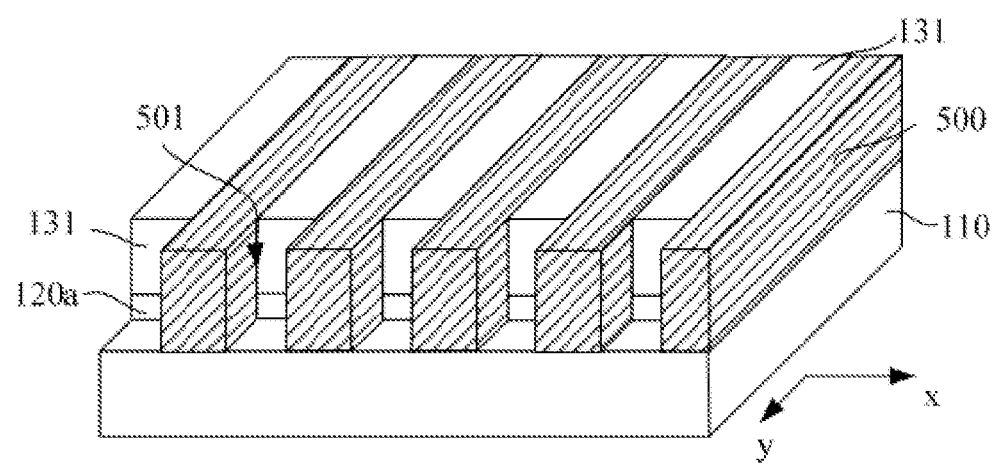

Referring to FIG. 3, a first isolating layer 500 filling the spacing between the active lines 131 is formed on the surface of the substrate 110. An end of the active lines 131 is etched to form an opening hole 501 exposing the surface of the substrate 110, and a side wall of the opening holes 501 exposes the sacrificial layer 120a.

The material of the first isolating layers 500 is different from that of the sacrificial layer 120a, and the material of the first isolating layers 500 is a dielectric material for providing electrical isolation between the active lines 131. In the present embodiment, the material of the first isolating layers 500 is silicon oxide. In the present embodiment, the first isolating layer 500 is formed by a chemical vapor deposition process. After an isolating material filling the spacing between the adjacent active lines 131 and covering the tops of the active lines 131 is formed on the surface of the substrate 100, the first isolating layer 500 is formed by planarizing the isolating material. In the present embodiment, the top of the first isolating layer 500 is flush with the top of the active line 131. In other embodiments, a patterned mask layer for patterning the active layer to form the active line is retained at the top of the active line 131, and the first isolating layer 500 is flush with the patterned mask layer. In other embodiments, the patterned masking layer has been removed prior to forming the first isolating layer 500. The first isolating layer 500 also covers the top of the active line. In the subsequent process, the top of the active line 131 may be protected.

After forming the first isolating layer 500, the end of the active lines 131 is etched to form an opening hole 501. A side wall of the opening holes 501 exposes the sacrificial layer 120a. Specifically, the opening holes 501 are formed on the ends of the active lines at the same side, or the opening holes are formed on the ends of the active lines at both sides. Moreover, the opening hole is formed on only one end of the active line, and the opening holes on the end at the same side are spaced apart from each other to reduce the density of the opening holes in a local region and increase a process window.

Figure 4:
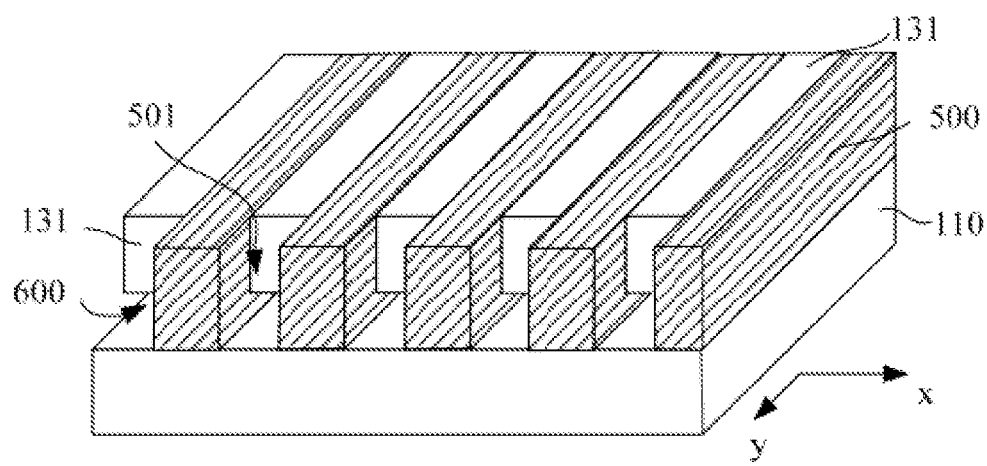

Referring to FIG. 4, the sacrificial layer 120a is removed along the opening hole 501, and a gap 600 is formed between the bottom of the active line 131 and the substrate 110.

The sacrificial layer 120a is removed by a wet etching process. Those skilled in the art would be able to select a suitable etching solution according to the material of the sacrificial layer 120a, so that during the wet etching process, there is a higher etching selection ratio between the sacrificial layer 120a and the active line 131 as well as a higher etching selection ratio between the sacrificial layer 120a and the first isolating layer 500, so as to reduce the influence on the active line 131 and the first isolating layer 500 during the removal of the sacrificial layer 120a.

After the sacrificial layer 120a is removed, the active line 131 is supported by the first isolating layer 500 and suspended above the substrate 110, and a gap 600 is formed between the active line 131 and the substrate 110.

Figure 5A:
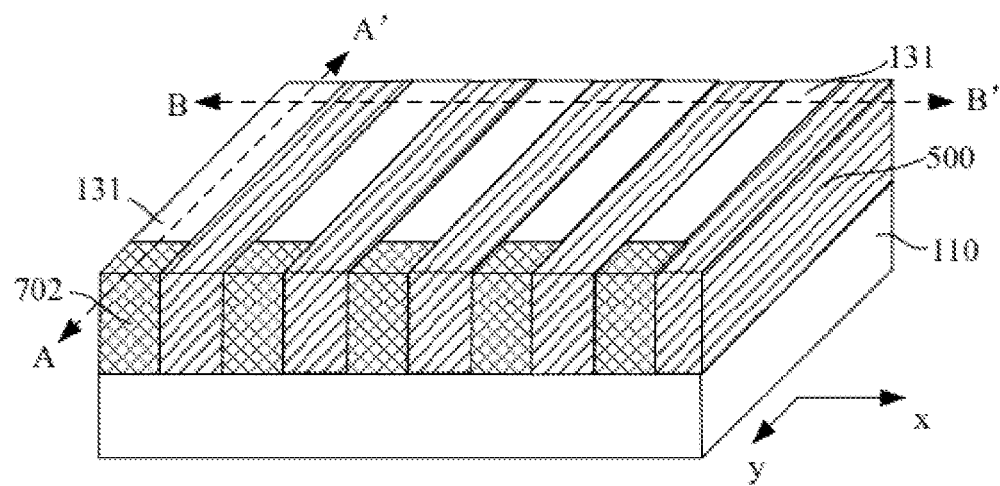
Figure 5B:
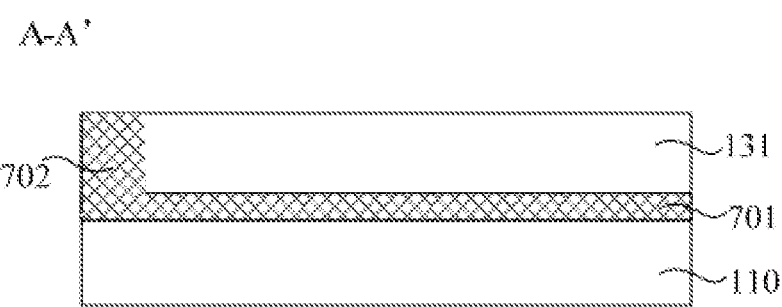
Figure 5C:
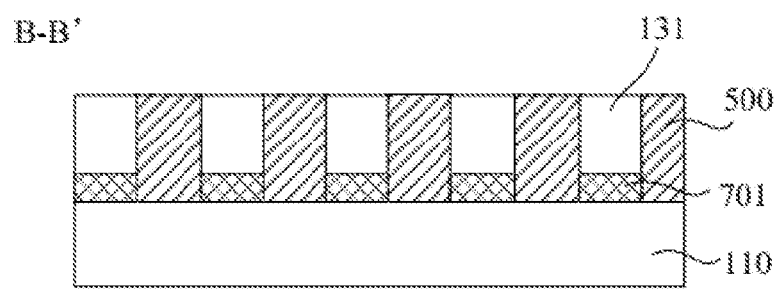

Referring to FIG. 5A to FIG. 5C, the gap 600 is filled with a conductive material to form bit lines 701 extending along the first direction. FIG. 5B is a cross-sectional schematic diagram taken along a secant line A-A' in FIG. 5A. FIG. 5C is a cross-sectional schematic diagram taken along a secant line B-B' in FIG. 5A.

A conductive material such as polysilicon or a metal material such as W, Co, Ag, or Al may be formed in the gap 600 by atomic layer deposition, chemical vapor deposition, or physical vapor deposition. The conductive material may also be a multilayer material, such as a combination of TiN and W.

The conductive material fills the gap 600 to form bit lines 701 at the bottoms of the active lines 131. The conductive material also fills the opening holes 501, and covers the tops of the first isolating layer 500 and the active line 131. The conductive material on the top of the first isolating layer 500 and the top of the active line 131 is removed subsequently through an etching back or planarization process. The opening hole 501 is filled with the conductive material to form a bit-line-connection line 702 in each opening hole 501. The bottom of the bit-line-connection line 702 is connected to the bit line 701 for leading out the bit line 701 buried below the active lines 131 so as to apply a control signal to the bit line 701. Each bit line 701 is located below a respective one of the active lines 131, forms an electrical connection with the active line 131, and extends along an extending direction of the active line 131. In the present embodiment, the bit line 701 and the bit-line-connection line 702 are simultaneously formed in the same process to save process cost.

Figure 6A:
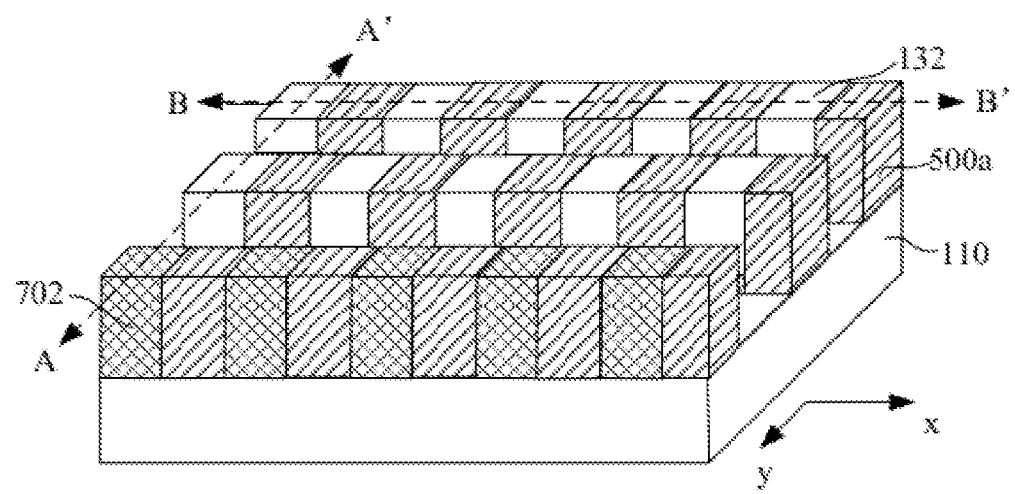
Figure 6B:
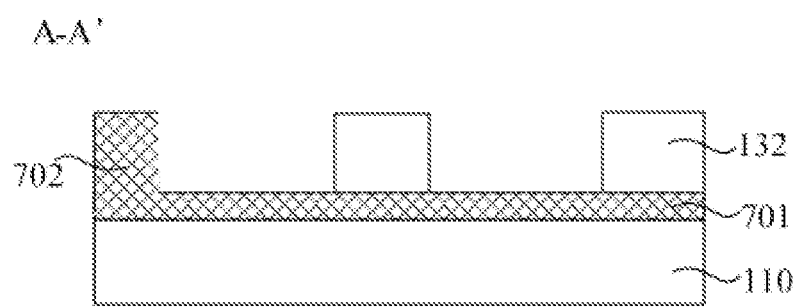
Figure 6C:
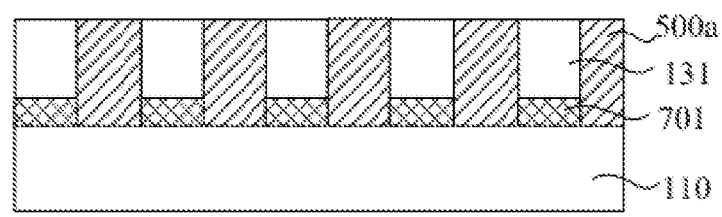

Referring to FIG. 6A to FIG. 6C, the active lines 131 are patterned to form a plurality of separate active pillars 132.

In the present embodiment, both the active lines 131 and the first isolating layers 500 are patterned to form elongated openings extending along an x-direction. The active lines 131 are patterned to form active pillars 132. The active pillars 132 are arrayed along the first direction (y-direction) and the second direction (x-direction). When the active line 131 is patterned, only the active lines 131 are etched up to the surfaces of the bit lines 701 so that the bit lines 701 at the bottoms of the active pillars 132 arranged along the y direction in the same straight line are continuous with each other.

In other embodiments, only the active lines 131 may be patterned by a selective etch process to form a plurality of active pillars 132 while keeping the first isolating layer 500 unpatterned.

In the present embodiment, an angle between the first direction and the second direction is 90°. In other embodiments, the angle between the first direction and the second direction is comprised between 60° and 90°.

Figure 7A:
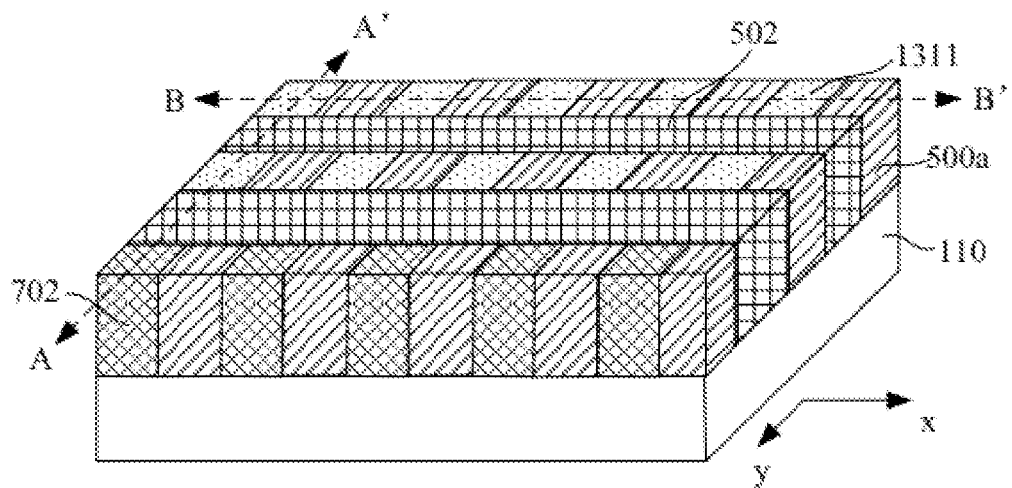
Figure 7B:
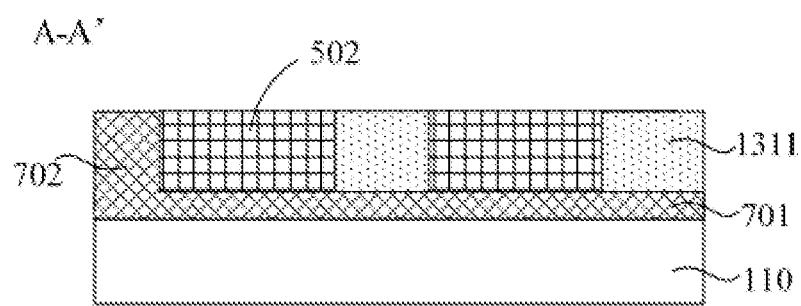
Figure 7C:
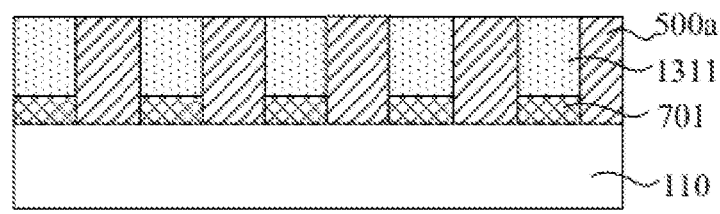

Referring to FIG. 7A to FIG. 7C, an isolating dielectric layer 502 is filled in openings located between adjacent active pillars 132 and adjacent first isolating layers 500a. Ions are implanted in the active pillars 132 to form first doped regions 1311.

In other embodiments, the first doped regions 1311 may also be formed by a diffusion process. Specifically, a transition layer with doping elements is formed on the surface of the substrate 110 between the adjacent active lines 131 (referring to FIG. 2). At least a part of doping elements in the transition layer 310 with doping atoms are diffused into the active lines 131 by a diffusion process to form doped active lines, and the doped active lines are patterned to form the first doped regions 1311. In other embodiments, a transition layer with doping elements may be formed on the surface of the substrate between the active pillars 132 (referring to FIG. 6A), and the doping elements are diffused into the active pillars 132 by a diffusion process to form the first doped regions 1311.

After a transition layer material is deposited on the surface of the substrate 110, a transition layer with a certain thickness may be formed by etching back the transition layer material. The thickness of the transition layer may be adjusted according to the size requirements of a source/drain region of a transistor to be formed. In some embodiments, the thickness of the transition layer is equal to the height of the active line 131 or the active pillar 132. In some embodiments, the transition layer may also cover the tops of the active lines 131 or the active pillars 132 to ensure that all regions of the entire active lines 131 or active pillars 132 are doped.

The material of the transition layer is different from that of the active line, and may be a material for facilitating impurity diffusion, such as polysilicon, or other dielectric materials such as silicon oxide, silicon nitride, and silicon oxynitride. The operation that the transition layer with doping elements is formed includes the following operations. After a certain thickness of undoped transition layer is formed on the surface of the semiconductor substrate 110, the transition layer is doped by ion implantation. At this moment, the top of the active line 131 or the active pillar 132 is covered with a patterned mask layer, and the transition layer can only be doped through the ion implantation by controlling the energy of the ion implantation. N-type or P-type ions, or atomic clusters with N-type or P-type ions are implanted into the transition layer according to the type of the transistor to be formed. The doping elements in the transition layer may be in the form of ions, atoms, compound molecules, or clusters. In other embodiments, the transition layer with doping elements may also be formed directly during the formation of the transition layer through an in-situ doping process by adding a doping gas with doping elements to a deposition process gas.

The diffusion process may be a thermal annealing process. An annealing process with suitable parameters is selected according to the diffusion efficiency of doping atoms, so that the doping elements in the transition layer are diffused into the active line 131 or the active pillar 132 to form the first doped region 1311. The doping concentration in the first doped region formed after the diffusion process may be adjusted by adjusting parameters such as the concentration of the doping elements in the transition layer, diffusion process time, and temperature.

In other embodiments, an in-situ doping process may be used to dope the active layer 130 during the formation of the active layer 130 by deposition through an epitaxial process. After the active layer 130 is patterned, the first doped region 1311 is formed.

The diffusion or in-situ doping can reduce damage to the surface of the active pillar 132 (first doped region 1311) as compared to forming the first doped region 1311 by ion implantation.

Figure 8:
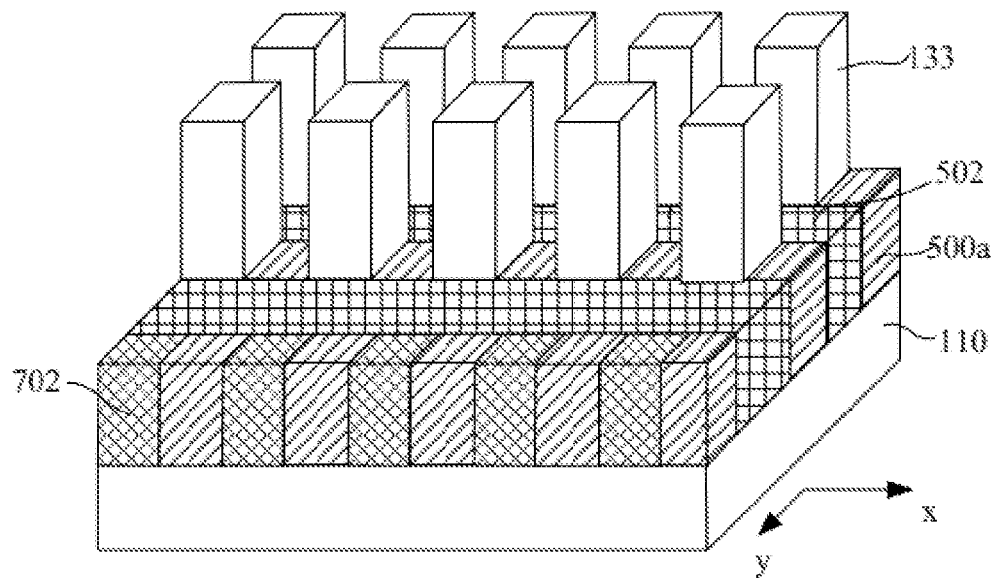

Referring to FIG. 8, semiconductor pillars 133 are formed on the top surfaces of the first doped regions 1311.

In the present embodiment, a semiconductor material is epitaxially grown on a top surface of the active pillars by a selective epitaxial process to form semiconductor pillars 133 on the top surfaces of respective ones of the active pillars. As a result of the selective epitaxial process, the semiconductor material will only be epitaxially grown on the active pillars, i.e., on the top surfaces of the first doped regions 1311. The material of the first doped region 1311 is the same as the material of the active pillar, i.e. Si. In other embodiments, the material of the semiconductor pillars 133 may also be other semiconductor materials such as SiGe. After semiconductor material with a certain thickness is epitaxially grown, the semiconductor material may be etched finished to form semiconductor pillars 133 with a smoother surface appearance.

In other embodiments, the operation that the semiconductor pillars are formed includes the following operations. A protective layer is formed on the first isolating layers and the isolating dielectric layer. Epitaxial through holes are formed in the protective layer. The bottom of each epitaxial through hole exposes a top surface of a respective one of the active pillars. A semiconductor material is epitaxially grown on the top surface of the active pillars to form semiconductor pillars in the epitaxial through holes. The protective layer is removed. Through the epitaxial through hole, the growth size and position of the semiconductor pillars are limited, and the appearance is not required to be finished by etching. The problems of collapse of the semiconductor pillars in the growth process or the finishing process, etc. can be avoided.

In other embodiments, a semiconductor material layer covering the surface of a structure shown in FIG. 7A may also be formed by a conventional deposition process, such as a CVD deposition process, and then the semiconductor material layer is patterned to form semiconductor pillars on the surfaces of the first doped regions 1311.

Figure 9A:
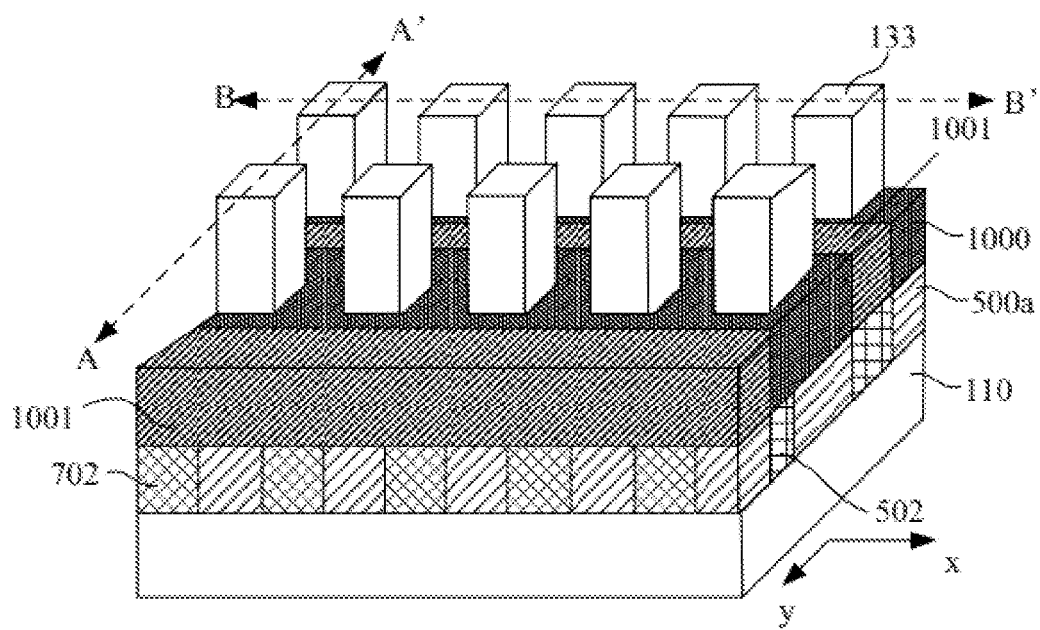
Figure 9B:
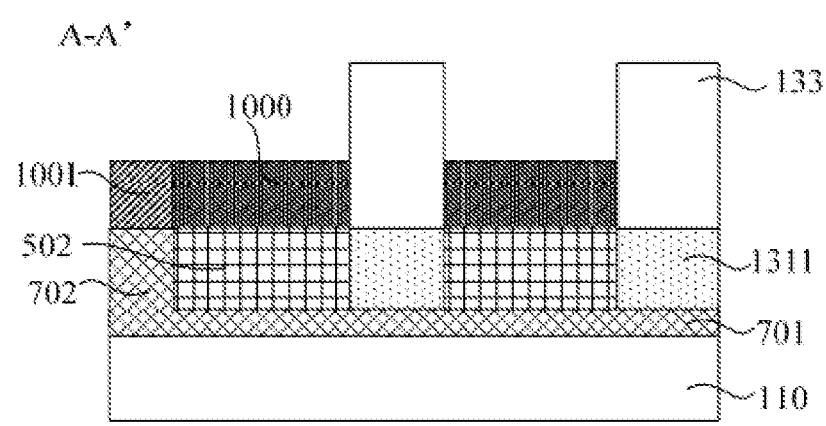
Figure 9C:
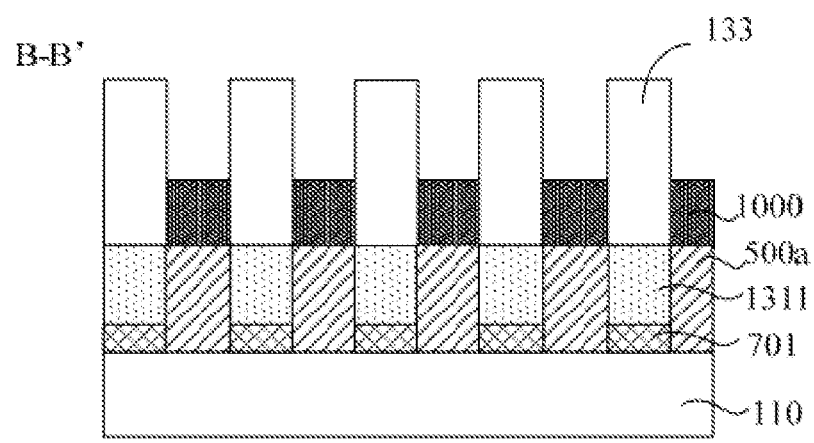

Referring to FIG. 9A to FIG. 9C, channel regions located on the surfaces of the first doped regions 1311 and gate structures 1000 surrounding the channel regions are formed in the semiconductor pillars 133.

In the embodiments of the present application, channel ion implantation is performed on the semiconductor pillars 133 by ion implantation, channel regions may be formed on the first doped regions 1311, and parameters such as a threshold voltage of a transistor to be formed may be adjusted by the channel ion implantation.

In other embodiments, channel doping may be performed at corresponding positions in the channel regions by an in-situ doping process during formation of the semiconductor pillars 133.

A gate dielectric layer and a gate layer are sequentially formed on the surfaces of the semiconductor pillars 133, the first isolating layers 500a, and the isolating dielectric layers 502. The gate dielectric layer and the gate layer are patterned to form gate structures 1000 that surround the channel regions of the semiconductor pillars 133 and expose top regions of the semiconductor pillars 133.

The gate dielectric layer may be a gate dielectric material such as silicon oxide, hafnium oxide, or aluminum oxide. The material of the gate layer may be a conductive material such as polysilicon, tungsten, copper, or aluminum. The gate dielectric layer and the gate layer which cover the surface of a structure in FIG. 9 may be sequentially formed through a deposition process. The gate structures 1000 are then formed by patterning the gate dielectric layer and the gate layer through an etching process. The gate structures 1000 surround the channel regions of the active pillars 132. The gate structure 1000 includes a gate dielectric layer and a gate electrode covering the gate dielectric layer. Only the gate electrode in the gate structure 1000 is shown in FIG. 9A.

In the present embodiment, gate electrodes of the gate structures 1000 surrounding on the surfaces of respective ones of the semiconductor pillars 133 arranged along the second direction (x direction) in the same straight line are connected with each other to form a word line.

In other embodiments, the gate structures 1000 on the semiconductor pillars 133 may also be independent of each other.

In order to electrically isolate the gate structures 1000 from one another, after the gate structures 1000 are formed, an isolating dielectric layer 1001 is filled between the adjacent gate structures 1000. In other embodiments, the isolating dielectric layers 1001 may be formed, the isolating dielectric layers 1001 may then be patterned to form openings, and the gate structures 1000 may be formed in the openings.

Figure 10A:
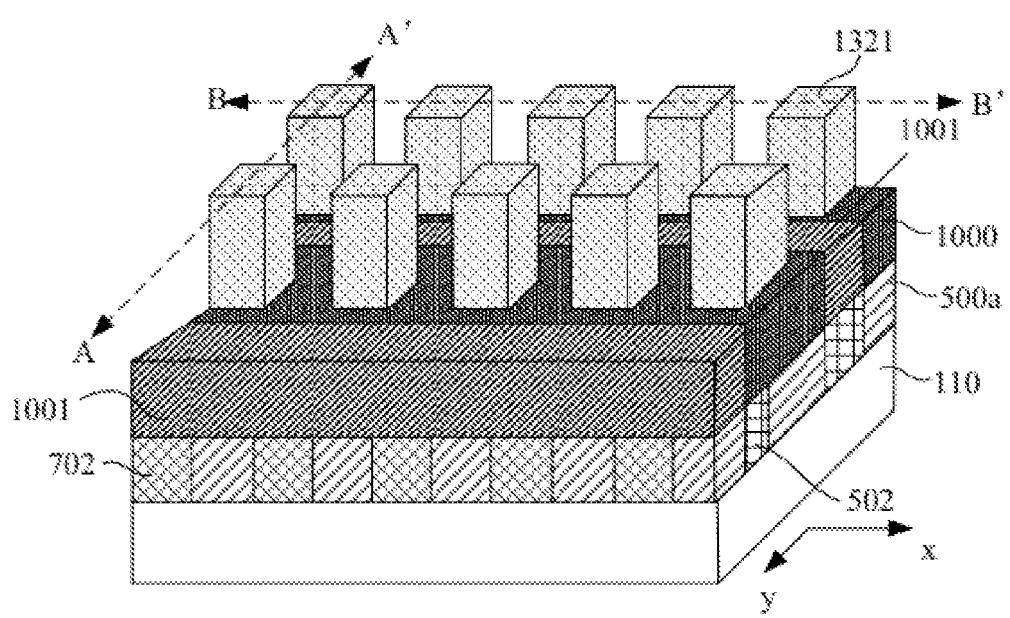
Figure 10B:
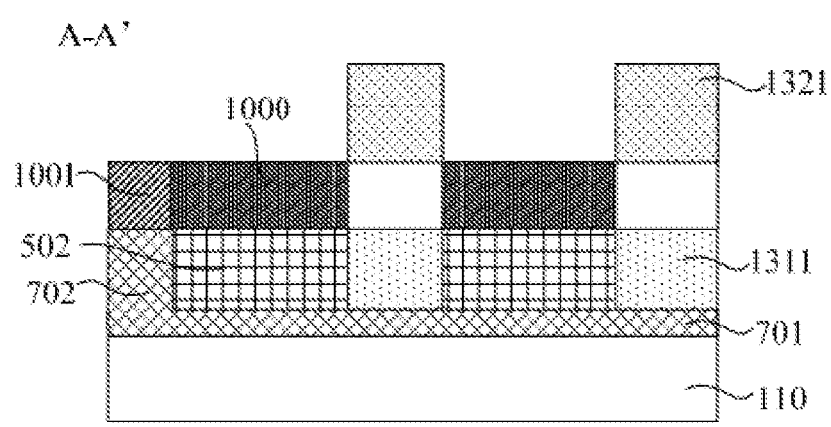
Figure 10C:
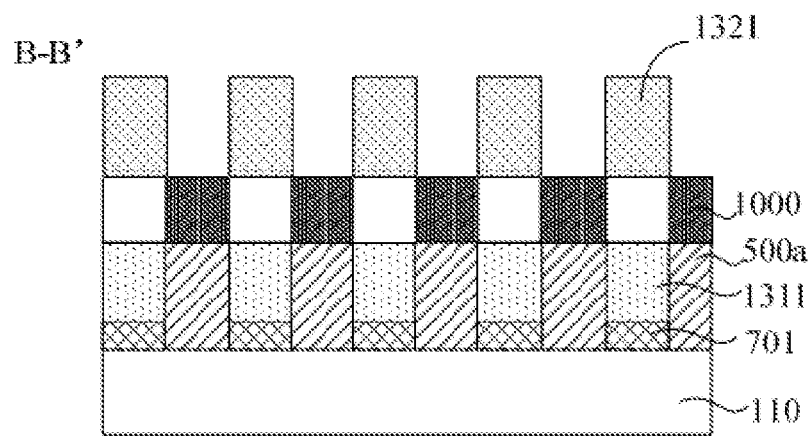

Referring to FIG. 10A to FIG. 10C, after the gate structure 1000 is formed, ions are implanted in the top regions of the semiconductor pillars 133 to form second doped regions 1321.

The doping type of the second doped region 1321 is the same as that of the first doped region 1311. The second doped regions 1321 and the first doped regions 1311 serve as a source or a drain of a vertical transistor, respectively. In other embodiments, the second doped regions 1321 may also be formed by suitable in-situ doping, diffusion, or implantation in the operations previously described, which is not described herein.

Figure 11A:
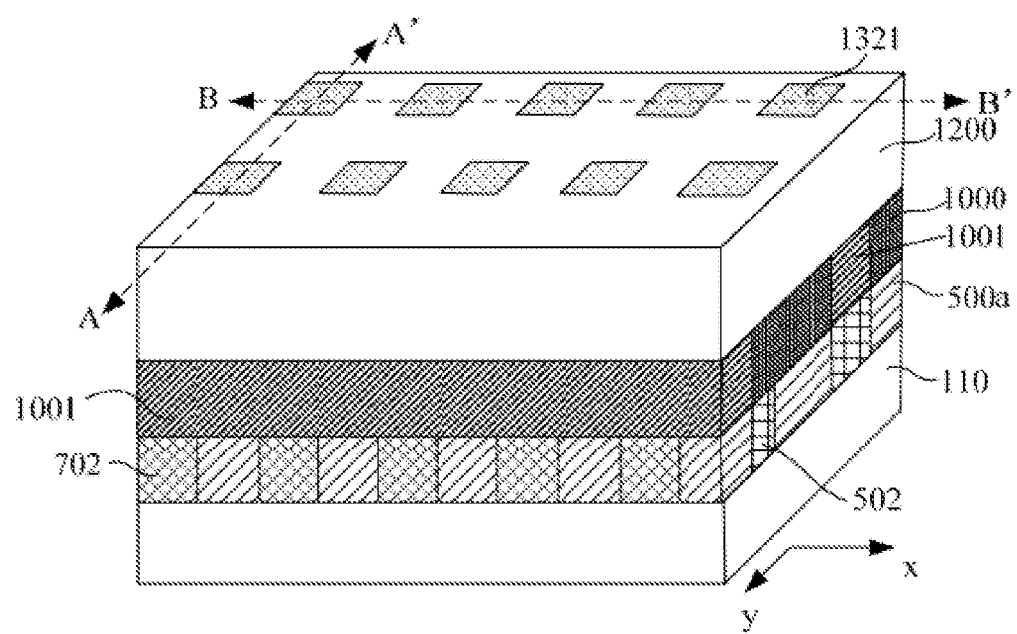
Figure 11B:
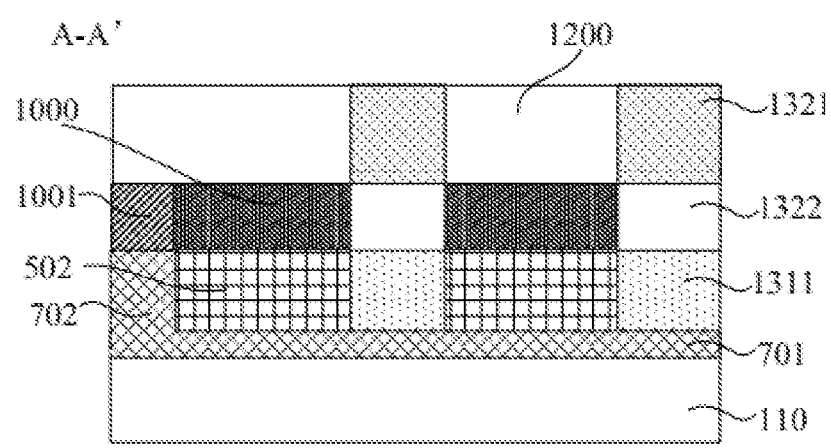
Figure 11C:
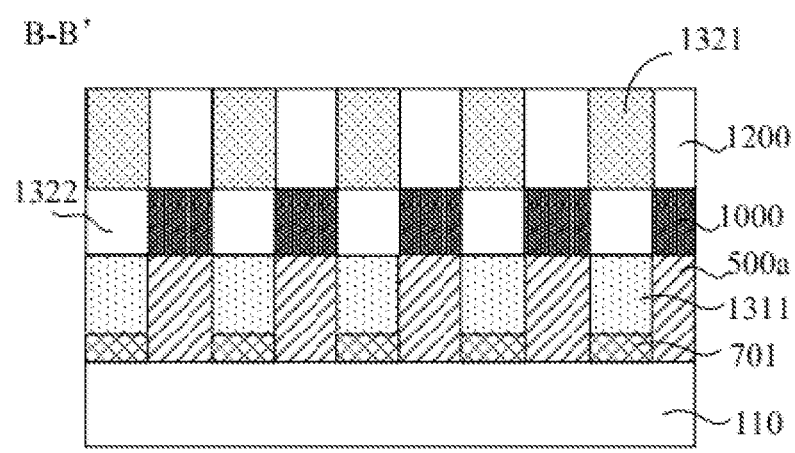

Referring to FIG. 11A to FIG. 11C, a second isolating layer 1200 covering the gate structures 1000 and the second doped regions 1321 is formed. The second isolating layer 1200 exposes a top surface of each second doped region 1321.

The material of the second isolating layer 1200 may be an insulating dielectric material such as silicon oxide and silicon oxynitride. The second isolating layer 1200 forms an isolating layer between vertical transistors together with the first isolating layer 500a, the isolating dielectric layer 502, and the isolating dielectric layer 1001, and provides a planar surface for forming other semiconductor structures or material layers above the vertical transistors.

In other embodiments, an interconnect structure connected to the bit-line-connection line 702 through the second isolating layer 1200 may also be formed.

According to the above method, a vertical transistor is formed on the substrate, and a buried bit line is formed between a lower portion of the first doped region at the bottom of the vertical transistor and the substrate, so that the area of the transistor can be reduced, and the problem of how to apply a bit line signal is solved.

The embodiments of the present application also provide a semiconductor structure.

Referring to FIG. 11A to FIG. 11C, schematic diagrams of a semiconductor structure according to an embodiment of the present application are shown.

The semiconductor structure includes: a substrate 110; a vertical transistor on the substrate 110, including a first doped region 1311, a channel region 1322, a second doped region 1321, and a gate structure 1000 surrounding the channel region 1322, which are disposed sequentially upwards from the surface of the substrate 110; and a bit line 701, connected to the first doped region 1311 and located between the bottom of the first doped region 1311 and the substrate 110.

A plurality of vertical transistors are formed on the semiconductor structure and arrayed along a first direction (y direction) and a second direction (x direction). The first doped regions 1311 at the bottoms of the vertical transistors arranged along the first direction in the same straight line are connected to the same bit line 701. The gate structures 1000 of the vertical transistors arranged along the second direction in the same straight line are connected with each other.

The semiconductor structure further includes: an isolating layer located on the substrate 110 and formed between the vertical transistors. The isolating layer includes a first isolating layer 500*a* and an isolating dielectric layer 502 between the adjacent bit lines 701 and between the adjacent first doped regions 1311, an isolating dielectric layer 1001 located between the adjacent gate structures 1000 and located on the surfaces of the first isolating layer 500*a* and the isolating dielectric layer 502, and a second isolating layer 1200 located between the adjacent second doped regions 1321 and located on the surface of the isolating dielectric layer 1001.

The semiconductor structure further includes opening holes penetrating through the first isolating layers 500*a*. A bit-line-connection line 702 is formed in each opening hole. The bottom of each bit-line-connection line 702 is connected to a respective one of the bit lines 701. In the present embodiment, the bit-line-connection line 702 is located at one side edge of a transistor array. One bit-line-connection line 702 is formed at one side of each row of transistors arranged along the y direction to be connected to the bit line 701 below the row of transistors. Specifically, the opening holes are formed on the ends of the active lines at the same side, or the opening holes are formed on the ends of the active lines at both sides. Moreover, the opening hole is formed on only one end of the active line, and the opening holes on the end at the same side are spaced apart from one another to reduce the density of the opening holes in a local region and increase a process window.

In the present embodiment, the channel region 1322 and the second doped region 1321 of each vertical transistor are formed in the semiconductor pillars on the surface of the first doped region 1311. A semiconductor layer in which the channel region 1322 and the second doped region 1321 are located and the semiconductor pillars are not integrally formed but are separately formed. In other embodiments, the first doped region 1311, the channel region 1322, and the second doped region 1321 of each vertical transistor are located in the same active pillar that is integrally formed. The first doped region 1311, the channel region 1322, and the second doped region 1321 are formed by doping.

Doping ions in the first doped region 1311 and/or the second doped region 1321 are formed by diffusion or ion implantation.

The embodiments of the present application also provide a memory and a method for forming the memory.

First, a semiconductor structure as shown in FIG. 11A to FIG. 11C is provided. The detailed description of the semiconductor structure will be given with reference to the above-described embodiments and will be omitted herein.

Figure 12:
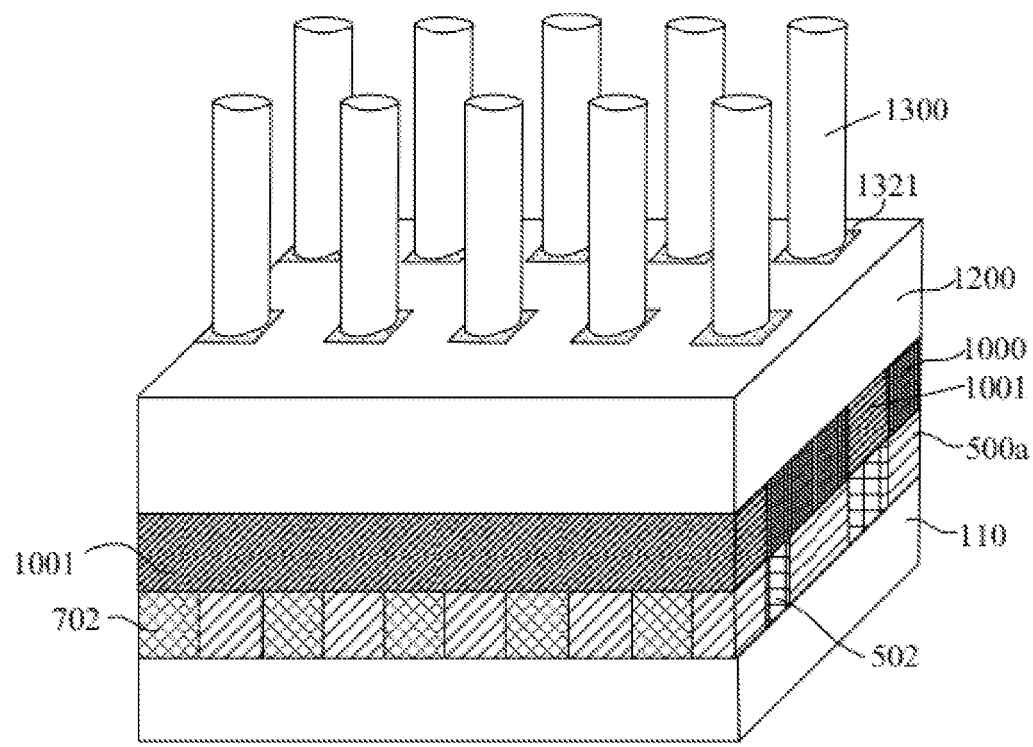
FIG. 12 is a schematic diagram of a memory according to an embodiment of the present application.

Referring to FIG. 12, a memory cell 1300 is formed above each vertical transistor. The memory cell 1300 is connected to the second doped region 1321 of the vertical transistor.

In one embodiment, the memory is a DRAM. The memory cell 1300 is a metal capacitor including an upper electrode, a lower electrode, and a capacitive dielectric layer between the upper electrode and the lower electrode. The structure of the capacitor may be a planar capacitor, a cylindrical capacitor, etc. Those skilled in the art would be able to select a capacitor with a suitable structure as a memory cell as required. In FIG. 12, the memory cell 1300 is merely an example and does not represent an actual structure of the capacitor. In the present embodiment, the second doped region 1321 of each transistor is connected to one memory cell to form a 1T 1C storage structure. The memory cell may include one capacitor, or more than two capacitors in parallel.

In other embodiments, in order to reduce the connection resistance between the second doped region 1321 and the memory cell 1300, a metal contact layer may also be formed on the surface of the second doped region 1321, and then the memory cell may be formed on the surface of the metal contact layer.

The memory cell 1300 is formed in a dielectric layer (not shown). An interconnect structure connecting the bit-line-connection line 702 and the gate structure 1000 may also be formed in the dielectric layer to connect the bit line and a word line to an external circuit.

In other embodiments of the present application, the memory cell may also be any one of a magnetic memory cell, a ferroelectric memory cell, a phase change memory cell, or a resistive memory cell.

Figure 13:
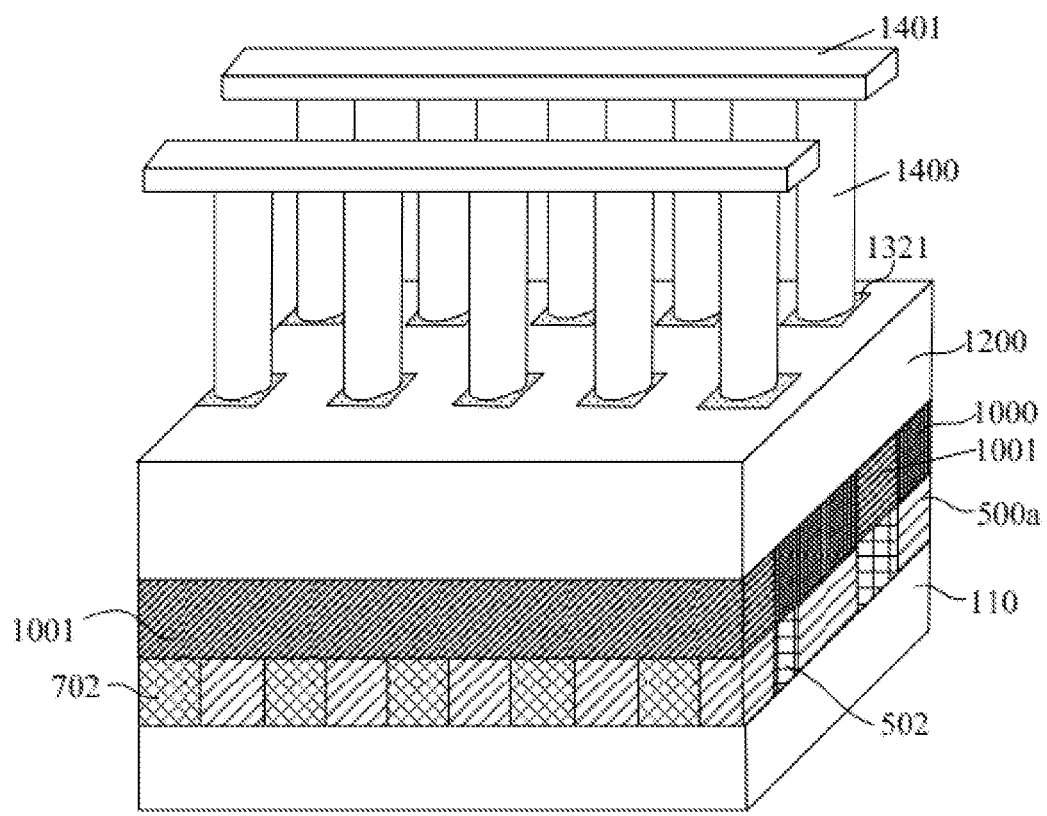
FIG. 13 is a schematic diagram of a memory according to an embodiment of the present application.

Referring to FIG. 13, a schematic diagram of a memory according to an embodiment of the present application is shown.

The memory is a FeRAM. A ferroelectric memory cell 1400 is formed above the second doped region 1321 of each vertical transistor of the semiconductor structure shown in FIG. 11A.

The ferroelectric memory cell includes a lower electrode connected to the second doped region 1321, an upper electrode located above the lower electrode, and a ferroelectric capacitor formed by a ferroelectric material layer between the upper electrode and the lower electrode. The material of the ferroelectric material layer may be lead zirconate titanate (PZT) or strontium barium titanate (SBT). The ferroelectric memory cell 1400 in FIG. 13 is only schematic and does not represent the structure of an actual ferroelectric memory cell. Those skilled in the art should be able to combine as required to form the ferroelectric memory cell 1400 with a corresponding structure, which is not limited herein.

For the ferroelectric memory cells 1400, it is also necessary to form plate lines 1401 connected to the upper electrodes above the ferroelectric memory cells 1400. In the present embodiment, ferroelectric memory cells arranged along the second direction (x direction) in the same straight line are connected to the same plate line 1401. Bidirectional pressurization of the ferroelectric memory cells 1400 may be realized by the plate line 1401 and the vertical transistor, thereby implementing data storage using the properties of the ferroelectric material layer.

In other embodiments, a magnetic memory cell may also be formed on the second doped region 1321 of the vertical transistor. The magnetic memory cell includes a magnetic tunnel junction including a fixed layer, a free layer, and a dielectric layer between the fixed layer and the free layer. The fixed layer is connected to the second doped region 1321.

In other embodiments, memory cells with other structures or types may be formed to form corresponding memories.

According to the memory and the method for forming the memory, vertical transistors are used as a control transistors connected to the memory cells, and buried bit lines connected to the control transistors are used, so that the storage density of the memory may be improved.

The above descriptions are merely preferred implementations of the present application. It should be noted that numerous modifications and embellishments may be devised by those of ordinary skill in the art without departing from the principle of the present application. Such modifications and embellishments are also considered to be within the scope of protection of the present application.

The invention claimed is:

1. A method for forming a semiconductor structure, comprising:
   providing a substrate, wherein a sacrificial layer and an active layer located on a surface of the sacrificial layer are formed on the substrate;
   etching the active layer and the sacrificial layer up to a surface of the substrate to form a plurality of active lines arranged in parallel and extending along a first direction;
   filling an opening located between two adjacent ones of the plurality of active lines to form a first isolating layer;
   etching an end of each of the plurality of active lines to form opening holes exposing the surface of the substrate, a side wall of the opening holes exposing the sacrificial layer;
   removing the sacrificial layer along the opening holes, to form a gap between a bottom of the plurality of active lines and the substrate;
   filling a conductive material in the gap to form a bit line extending along the first direction;
   patterning the plurality of active lines to form a plurality of separate active pillars that are arrayed along the first direction and a second direction;
   forming semiconductor pillars on top surfaces of respective ones of the plurality of separate active pillars;
   forming a first doped region in the plurality of separate active pillars;
   forming a channel region above the first doped region and a second doped region above the channel region in the semiconductor pillars; and
   forming a gate structure surrounding the channel region; and
   forming a second isolating layer covering the gate structure and the second doped region, the second isolating layer exposing a top surface of the second doped region.

2. The method for forming the semiconductor structure of claim 1, further comprising: filling the conductive material in the opening holes to form a bit-line-connection line in the opening holes, a bottom of the bit-line-connection line being connected to the bit line.

3. The method for forming the semiconductor structure of claim 2, wherein the bit-line-connection line and the bit line are formed in a same process.

4. The method for forming the semiconductor structure of claim 2, wherein the opening holes are formed at both ends of each of the plurality of active lines, and the opening holes on the end of the plurality of active lines at a same side are spaced apart from each other.

5. The method for forming the semiconductor structure of claim 1, wherein forming the first doped region comprises: implanting first ions in the plurality of separate active pillars to form the first doped region in the plurality of separate active pillars, and wherein forming the second doped region comprises: implanting second ions in the semiconductor pillars to form the second doped region on a top of the semiconductor pillars.

6. The method for forming the semiconductor structure of claim 1, wherein forming the first doped region comprises: doping the active layer using an in-situ doping process to form a first doped layer during formation of the active layer through an epitaxial growth process; and patterning the first doped layer into the first doped region after the plurality of separate active pillars are formed by patterning the active layer.

7. The method for forming the semiconductor structure of claim 1, wherein forming the channel region and the second doped region comprises: in-situ doping the semiconductor pillars using an in-situ doping process during formation of the semiconductor pillars through an epitaxial growth process, to sequentially form the channel region and the second doped region.

8. The method for forming the semiconductor structure of claim 1, further comprising: forming an isolating dielectric layer filling openings between the plurality of separate active pillars.

9. The method for forming the semiconductor structure of claim 8, wherein forming the semiconductor pillars comprises: forming a protective layer on the first isolating layer and the isolating dielectric layer; forming epitaxial through holes in the protective layer, a bottom of the epitaxial through holes exposing a top surface of a respective one of the plurality of separate active pillars; epitaxially growing a semiconductor material on the top surfaces of the plurality of separate active pillars to form the semiconductor pillars in respective ones of the epitaxial through holes; and removing the protective layer.

10. The method for forming the semiconductor structure of claim 8, wherein after a semiconductor material is epitaxially grown on the top surfaces of the plurality of separate active pillars, etching the semiconductor material to form the semiconductor pillars on the top surfaces of respective ones of the plurality of separate active pillars.

11. The method for forming the semiconductor structure of claim 8, wherein forming the gate structure comprises: sequentially forming a gate dielectric layer and a gate layer on surfaces of the semiconductor pillars, the first isolating layer, and the isolating dielectric layer; and patterning the gate dielectric layer and the gate layer to form the gate structure that is located on the surfaces of the first isolating layer and the isolating dielectric layer and surrounds a part of the semiconductor pillars at a height, and to expose a top region of the semiconductor pillars.

12. The method for forming the semiconductor structure of claim 11, wherein a plurality of the gate structures surrounding on the surfaces of respective ones of the semiconductor pillars arranged along the second direction in a same straight line are connected with each other.

* * * * *